United States Patent
Kokado

(10) Patent No.: US 7,009,821 B2
(45) Date of Patent: Mar. 7, 2006

(54) FERROMAGNETIC TUNNEL JUNCTION ELEMENT EXHIBITING HIGH MAGNETORESISTIVITY AT FINITE VOLTAGE AND TUNNEL MAGNETORESISTIVE HEAD PROVIDED THEREWITH, MAGNETIC HEAD SLIDER, AND MAGNETIC DISK DRIVE

(75) Inventor: Satoshi Kokado, Tsuchiura (JP)

(73) Assignee: Hitachi, Ltd., Tokyo (JP)

( * ) Notice: Subject to any disclaimer, the term of this patent is extended or adjusted under 35 U.S.C. 154(b) by 0 days.

(21) Appl. No.: 10/928,273

(22) Filed: Aug. 30, 2004

(65) Prior Publication Data

US 2005/0024791 A1  Feb. 3, 2005

Related U.S. Application Data

(63) Continuation of application No. 10/196,149, filed on Jul. 17, 2002, now Pat. No. 6,804,090.

(30) Foreign Application Priority Data

Jan. 18, 2002  (JP) .......................... P2002-010475

(51) Int. Cl.
 *G11B 5/33* (2006.01)
(52) U.S. Cl. ................................. 360/324.2
(58) Field of Classification Search ..................... None
 See application file for complete search history.

(56) References Cited

U.S. PATENT DOCUMENTS 6,331,944 B1 * 12/2001 Monsma et al. ............ 365/171
6,452,892 B1 *  9/2002 Kumagai et al. ........... 369/126
6,462,641 B1   10/2002 Dieny et al.
6,549,454 B1    4/2003 Slaughter
6,574,079 B1    6/2003 Sun et al.
6,657,431 B1   12/2003 Xiao

OTHER PUBLICATIONS

T. Miyazaki et al., "Giant Magnetic Tunneling Effect in Fe/Al$_2$O$_3$/Fe Junction" Journal of Magnetism and Magnetic Materials 139 (1995) L231-L234.

J. S. Moodera et al. "Large Magnetoresistance at Room Temperature in Ferromagnetic Thin Film Tunnel Junctions," Physical Review Letters, vol. 74, No. 16, (1995), pp. 3273-3276.

M. Julliere, "Tunneling Between Ferromagnetic Film," Physics Letters, vol. 54A, No. 3, (1975), pp. 225-226.

(Continued)

*Primary Examiner*—Angel Castro
(74) *Attorney, Agent, or Firm*—Antonelli, Terry, Stout and Kraus, LLP

(57) ABSTRACT

A ferromagnetic tunnel junction element to produce a high ratio of magnetoresistance at finite voltages including the element operating voltage, and a device provided therewith such as tunnel magnetoresistive head, magnetic head slider, and magnetic disk drive. The ferromagnetic tunnel junction element has a laminate structure of ferromagnetic layer/ metallic layer/insulating layer/metallic layer/ferromagnetic layer. (The metallic layer is one atom thick or two atoms thick.) The metallic layer and insulating layer have the crystalline regularity. The element is capable of detecting magnetism with its high magnetoresistivity, about three times that of conventional elements, at finite voltages. This element makes it possible to realize a highly sensitive magnetoresistive head. The magnetic head is used for the magnetic head slider which realizes a magnetic disk drive capable of reproducing magnetic information with high sensitivity.

10 Claims, 14 Drawing Sheets

CURRENT DIRECTION

OTHER PUBLICATIONS

J.M. De Teresa et al., "Inverse Tunnel Magnetoresistance in Co/SrTiO3/La07Sr0.3MnO3: New Ideas on Spin-Polarized Tunneling," Physical Review Letters, vol. 82, No. 21, (1999), pp. 4288-4291.

C. Caroli et al., "Direct Calculation of the Tunneling Current," J. Phys. C: Solid St. Phys., (1971), vol. 4, Printed in Great Britain, pp. 916-929.

T. Nakajima, "Jisei no Riron," Theory of Magnetism, pp. 88-96.

J. Kanamori et al., "Kotai-Kozou to Bussei," Solids-Structure and Characteristic.

K. Yoshida, "Jeisei" Magnetism.

Kittel, Introduction to Solid State Physics (Japanese Edition from Maruzen Bookstore).

W. A. Harrison, "Solid State Table of the Elements," Electronic Structure and the Properties of Solids, San Francisco (1980).

J. Inoue et al, "Theory of Giant Magnetoresistance in Metallic Superlattices," Journal of the Physical Society of Japan, vol., 60, No. 2 (1991) pp. 376-379.

* cited by examiner

CURRENT DIRECTION

FERROMAGNETIC TUNNEL JUNCTION ELEMENT EXHIBITING HIGH MAGNETORESISTIVITY AT FINITE VOLTAGE AND TUNNEL MAGNETORESISTIVE HEAD PROVIDED THEREWITH, MAGNETIC HEAD SLIDER, AND MAGNETIC DISK DRIVE

CROSS-REFERENCE TO RELATED APPLICATIONS

This is a Continuation application of application Ser. No. 10/196,149, filed Jul. 17, 2002 now U.S. Pat. No. 6,804,090, the entire disclosure of which is hereby incorporated herein by reference.

BACKGROUND OF THE INVENTION

1. Field of the Invention

The present invention relates to a ferromagnetic tunnel junction element to sense a magnetic field and relates also to a device provided therewith such as tunnel magnetoresistive head, magnetic head slider, and magnetic disk drive.

2. Description of the Related Art

High-density magnetic recording needs a sophisticated read head. This requirement is met by the magnetoresistive head based on giant magnetoresistance effect (GMR effect), which has recently gained commercial acceptance. The current magnetoresistive head produces its GMR effect through the spin valve film-composed of ferromagnetic layer, non-magnetic metal layer, and ferromagnetic layer. The spin valve film of this structure has a limited magnetoresistance ratio of about 10%. Hence, a more sensitive magnetoresistive element is required.

Researches to meet this requirement have recently revealed a phenomenon called ferromagnetic tunnel effect. This tunnel effect manifests itself in the junction structure composed of ferromagnetic layer, amorphous insulating layer, and ferromagnetic layer, and it depends on the relative angle of magnetization of the two ferromagnetic layers. (J. Magn. Mater. 139, L231 (1995); Phys. Rev. Lett. 74, 3273 (1995)) Because of its ability to give a magnetoresistance ratio greater than 10% at room temperature, the above-mentioned phenomenon has attracted keen attention on research and development for new magnetoresistive elements. For its extremely high sensitivity to magnetic field, the ferromagnetic tunnel effect film is greatly expected to find use as a read head for ultra-high-density magnetic recording exceeding 100 Gbit/inch$^2$.

The ferromagnetic tunnel effect had been analyzed by Julliere's theory (Phys. Lett. A54, 252 (1975)), which is useful particularly for the system containing an amorphous insulating layer. This theory defines the spin polarization as $P=(D\uparrow-D\downarrow)/(D\uparrow+D\downarrow)$, where $D\uparrow$ and $D\downarrow$ denote respectively the density of state (or the number of states per unit energy) of up-spin and down-spin in the ferromagnetic layer at Fermi level. The value of P is used to represent the magnetoresistance ratio at zero voltage as follows.

$$TMR=100\times 2P^2/(1-P^2)[\%]$$

The foregoing expression indicates that the larger the value of P, the higher the magnetoresistance ratio. This idea has stimulated the research on the tunnel junction with $La_{0.7}Sr_{0.3}MnO_3$ which is a half-metallic ferromagnetic substance having P=1 at the absolute zero (Phys. Rev. Lett., 82, 4288 (1999)) This half-metallic ferromagnetic substance is regarded as an effective spin injector in view of the fact that only up-spin electrons contribute to conduction. This substance is under the stage of basic research and its practical application is being pursued.

OBJECT AND SUMMARY OF THE INVENTION

The current tunnel magnetoresistive element represented by Co/Al—O/Co involves several problems in its practical use. The most serious among them is that the magnetoresistivity steeply decreases with increasing voltage. In other words, at the element's operating voltage of 0.2–0.4V, the magnetoresistivity decreases by more than half from that at zero voltage. Moreover, Julliere's expression suggests that the Co/Al—O/Co having an amorphous insulating layer would hardly give a magnetoresistivity higher than 40%.

On the other hand, it has been found that $La_{0.7}Sr_{0.3}MnO_3$ as a spin injector does not work at room temperature because the terminal layer most contributive to conduction has a Curie temperature as low as about 180 K. Another problem is difficulty in film formation. Under these circumstance, it is an urgent issue to develop a new material or a new film construction.

Accordingly, it is an object of the present invention to provide a ferromagnetic tunnel junction element with film structure exhibiting high magnetoresistivity at finite voltage (including the element operating temperature) and devices provided therewith such as tunnel magnetoresistive head, magnetic head slider, and magnetic disk drive.

The present invention is directed to a ferromagnetic tunnel junction element of the type having a tunnel insulating layer and a first and second ferromagnetic layers arranged on both sides of said tunnel insulating layer, wherein said tunnel insulating layer is in indirect contact with said first and second ferromagnetic layers with a noble metal layer interposed between them.

The ferromagnetic tunnel junction element mentioned above has said noble metal layer in the form of single crystal of noble metal atoms or in the form of monoatomic layer or diatomic layer of noble metal atoms.

The ferromagnetic tunnel junction element mentioned above has said noble metal layer which contains any element of Au, Ag, and Cu.

The present invention is directed also to a magnetic disk drive of the type having a magnetic recording medium, a spindle motor to rotate said magnetic recording medium, a magnetic head which is so mounted on a slider as to perform information recording and reproducing on said magnetic recording medium, and an actuator to move said magnetic head to a desired position on the magnetic recording disk, wherein said magnetic head is provided with a ferromagnetic tunnel junction element and a power source to supply electric current thereto, said ferromagnetic tunnel junction element having a tunnel insulating layer and a first and second ferromagnetic layers arranged on both sides thereof, said tunnel insulating layer being in indirect contact with said first and second ferromagnetic layers with a noble metal layer interposed between them.

It is another object of the present invention to provide a magnetic disk drive of the type having a magnetic recording medium, a spindle motor to rotate said magnetic recording medium, a magnetic head which is so mounted on a slider as to perform information recording and reproducing on said magnetic recording medium, and an actuator to move said magnetic head to a desired position on the magnetic recording disk, wherein said magnetic head is provided with a ferromagnetic tunnel junction element and a power source to supply electric current thereto, said ferromagnetic tunnel junction element having a tunnel insulating layer and a first and second ferromagnetic layers arranged on both sides thereof, said tunnel insulating layer being in indirect contact with said first and second ferromagnetic layers with a noble metal layer interposed between them.

In the aforesaid magnetic disk drive, said first and second ferromagnetic layers contain Co or $Co_xFe_{1-x}$ (x=0.7–1.0), and the aforesaid magnetic disk drive has a means to control the drive voltage applied to said ferromagnetic tunnel junction element above 0.01 V and below 0.1 V.

In the aforesaid magnetic disk drive, said first and second ferromagnetic layers contain Co or $Co_xFe_{1-x}$ (x=0.7–1.0), and the aforesaid magnetic disk drive has a means to control the drive voltage applied to said ferromagnetic tunnel junction element above 0.2 V and below 0.5 V.

In the aforesaid magnetic disk drive, said first and second ferromagnetic layers contain Fe, and the aforesaid magnetic disk drive has a means to control the drive voltage applied to said ferromagnetic tunnel junction element above 0.01 V and below 0.15 V.

In the aforesaid magnetic disk drive, said first and second ferromagnetic layers contain Fe, and the aforesaid magnetic disk drive has a means to control the drive voltage applied to said ferromagnetic tunnel junction element above 0.3 V and below 0.7 V.

In the aforesaid magnetic disk drive, said first and second ferromagnetic layers contain $Ni_xFe_{1-x}$ (x=0.7–1.0), and the aforesaid magnetic disk drive has a means to control the drive voltage applied to said ferromagnetic tunnel junction element above 0.03 V and below 0.06 V.

Other and further objects, features and advantages of the invention will appear more fully from the following description.

DESCRIPTION OF THE PREFERRED EMBODIMENTS

Solution to the above-mentioned problems needs a new layer construction in place of the conventional layer construction such as Co/Al—O/Co containing an amorphous insulating layer. Several models of layer construction were examined for their characteristics by computer simulation based on the quantum theory.

The computer simulation describes the system in terms of the single-orbital tight binding model. The parameters for this model is evaluated based on the result of calculations of the first principle electron state. Moreover, the value of current at the absolute zero is calculated by applying to this model the method of Keldysh-Green Function (J. Phys. C: Solid St. Phys. 4, 916 (1971)).

The result of the computer simulation has suggested that the above-mentioned problem is solved with the ferromagnetic tunnel junction element which is composed of a first ferromagnetic layer and a second ferromagnetic layer which face each other with an insulating layer interposed between them, said first and second ferromagnetic layers being in indirect contact with said insulating layer, with a metallic layer interposed between them, said metallic layer being a monoatomic layer or diatomic layer of any of Au, Ag, and Cu having conduction electrons, said metallic layer and said insulating layer having crystalline regularity. In addition, the object of the present invention is achieved with those devices which are provided with the ferromagnetic tunnel junction element, such as magnetic head, head slider, and magnetic disk drive.

The examples of the present invention will be described in more detail with reference to the accompanying drawings.

EXAMPLE 1

Figure 1:
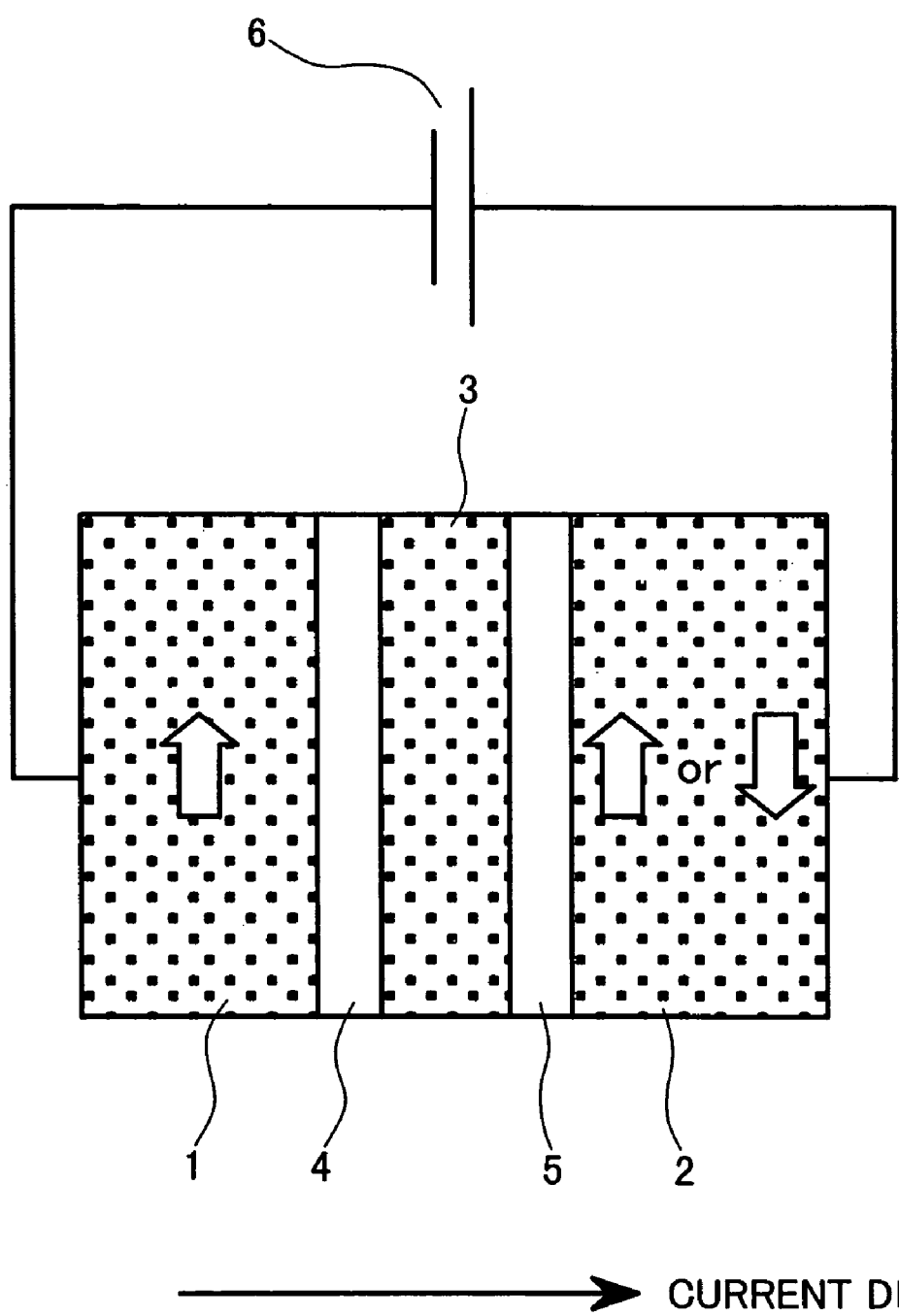
FIG. 1 is a schematic diagram showing the constitution of the ferromagnetic tunnel junction element pertaining to the present invention.

FIG. 1 is a schematic diagram showing the magnetic sensing device pertaining to the present invention. The magnetic sensing device is composed of a first ferromagnetic layer 1, a first metallic layer 4, an insulating layer 3, a second metallic layer 5, and a second ferromagnetic layer 2, which are sequentially laminated one over another. It also has a constant-voltage power supply 6. The first and second metallic layers are monoatomic layers or diatomic layers, and the metallic layers and the insulating layer have crystalline regularity. The second ferromagnetic layer 2 magnetizes freely in any direction in response to external magnetic fields (not shown). Thus, the electric resistance in the direction perpendicular to the film plane changes in proportion to the angle of rotation, and this change in resistance manifests itself as the magnetoresistive effect, which is expressed in terms of the difference between P (parallel) and AP (antiparallel) as explained in detail below.

The computer simulation for the tunnel magnetoresistive material employs (1) the tight binding model and (2) the method of Keldysh-Green Function. For (1), refer to "Jisei no Riron" (Theory of Magnetism) by T. Nagamiya, from Yoshioka Bookstore; "Kotai—Kozou to Bussei" (Solids—Structure and Characteristics) by J. Kanamori et al. from Iwanami Bookstore; and "Jisei" (Magnetism) by K. Yoshida, from Iwanami Bookstore. For (2), refer to J. Phys. C: Solid St. Phys. 4, 916 (1971). First, the tunnel junction system will be described in terms of the tight binding model. Then, the method of Keldysh-Green Function will be applied to the system to investigate the electrical conductivity.

(1) Explanation of the Tight Binding Model

Figure 2:
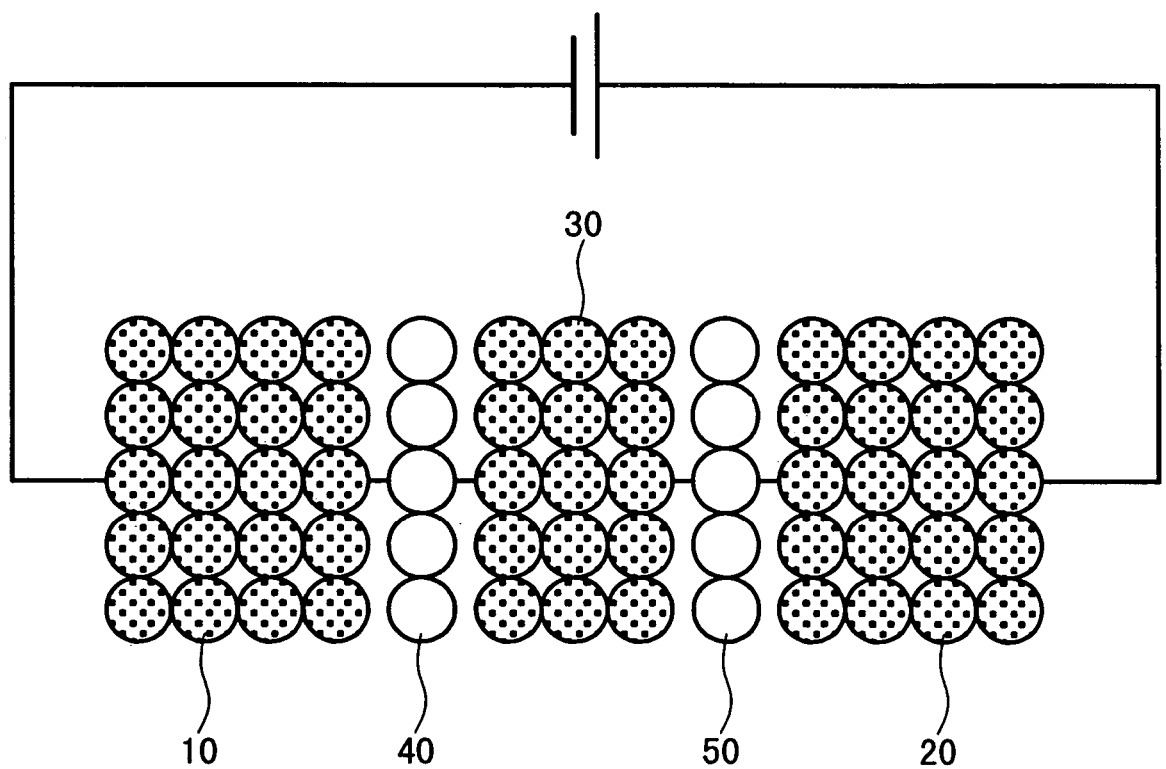
FIG. 2 is a diagram showing the arrangement of atoms which is a model of the ferromagnetic tunnel junction element pertaining to the present invention.

Let us consider a system consisting of atoms arranged in the actual (two-dimensional) space as shown in FIG. 2. Each atom inherently has a plurality of orbitals (s-orbital, p-orbital, d-orbital, and so on) which differ in orbital angular momentum. Some orbitals greatly contribute to the magnetoresistive effect, but others do not. In this discussion, consideration is given only to those orbitals which greatly contribute to the magnetoresistive effect. Thus, the ferromagnetic layer, metallic layer, and insulating layer are described respectively in terms of d-orbital, s-orbital, and s-orbital. In other words, it is assumed that each atom has a single orbital. In this case, the parameter representing individual atoms includes site energy (energy E of electrons on the orbit) and transfer integral (t) (magnitude of energy required for transfer from one site to the other). The transfer integral (t) has the dimension of energy. See FIG. 3.

Figure 3:
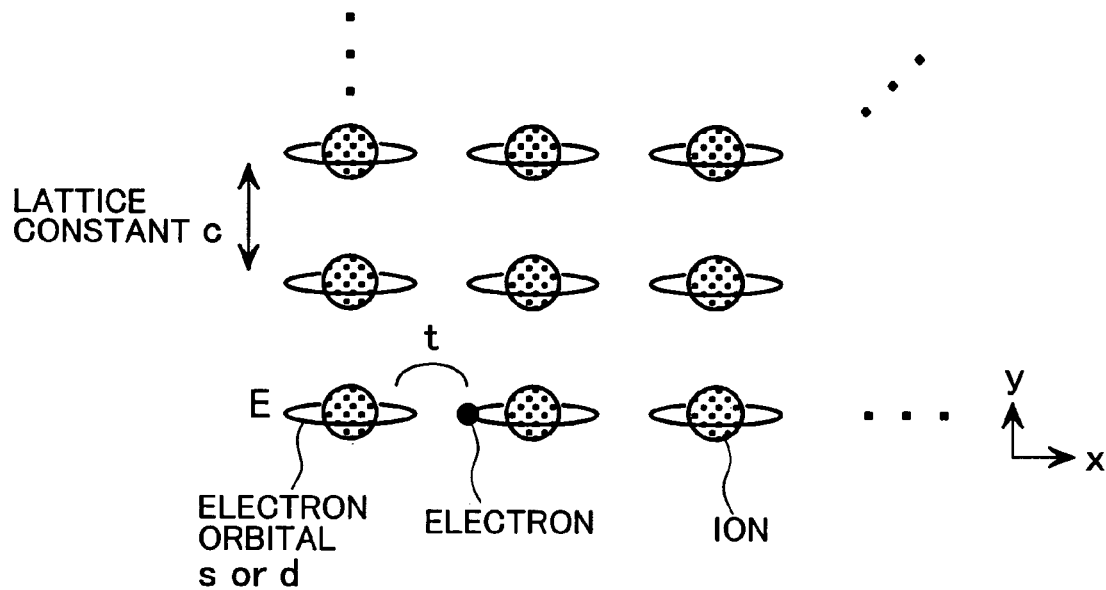
FIG. 3 is a schematic diagram showing atoms having the s-orbital or d-orbital. "t" denotes the transfer integral, and "E" denotes site energy.

The two-dimensional energy expression (dispersion relation) shown in FIG. 3 may be written as follows by using the parameters.

$$E(k) = E - 2t[\cos(k \times c) + \cos(k \times c)]$$

where, k [=(kx, ky)] denotes the two-dimensional wave number vector (it is related with momentum P by P=ηk, where η is Planck constant divided by 2π), and c denotes the lattice constant. Moreover, this energy expression gives the density of states, which represents the number of states per unit energy. The density of states is defined as follows, in which ε denotes an arbitrary energy.

$$D(\epsilon) = \Sigma k \, D(\epsilon, k) / \Sigma kl$$

$$D(\epsilon, k) = \delta(\epsilon - E(k))$$

where, Σk denotes the sum over k in the first Brillouin zone (Kittel, Introduction to Solid State Physics).

Figure 4:
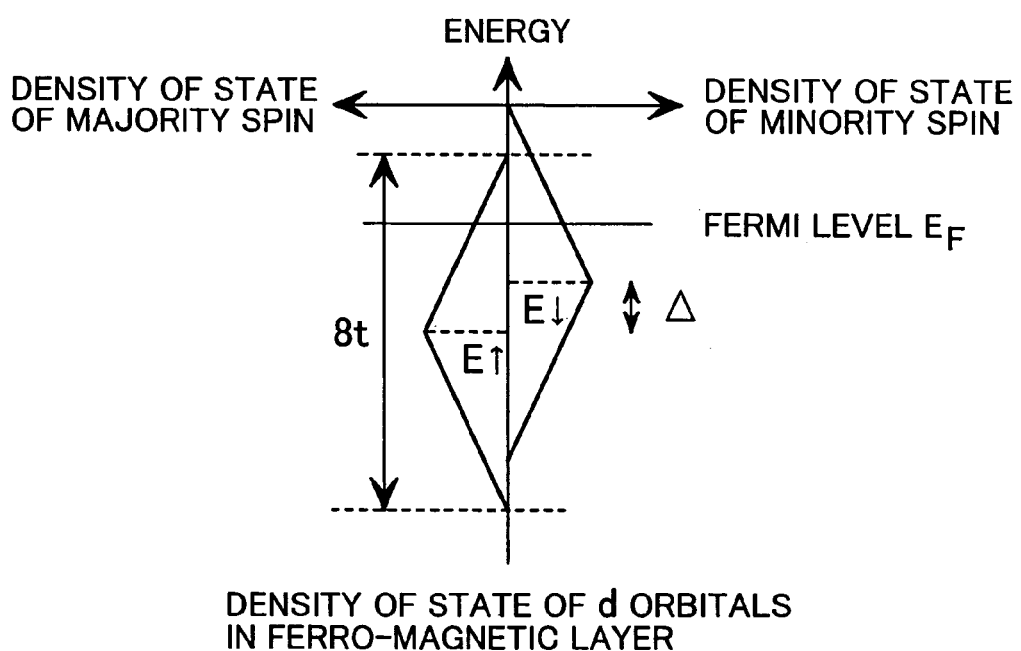
FIG. 4 is a schematic diagram showing the density of state of d-orbitals in the ferromagnetic layer.

Now, let us pay attention only to d-orbital in the ferromagnetic layer. When atoms having d-orbital are arranged in three-dimensional space, they assume the density of state in one layer as schematically shown in FIG. 4. The center of the density of state of up-spin and down-spin correspond respectively to the site energies E↑ and E↓, and the width of the density of state is related with the transfer integral t. Incidentally, $E_F$ stands for the Fermi level, which represents the maximum energy level when all states above the ground state are occupied by electrons.

The following is an explanation of the site energy $E_S$ (s=↑ or ↓) and the transfer integral t. The site energy $E_S$ is approximated as follows.

$$E_S = E_{para} - {}_s U \langle M_i \rangle / 2$$

$$E_{para} = E_0 + U \langle N_i \rangle / 2$$

$$E_0 = \int_{allspace} dr_1 \phi^*(r_1 - R_i)[-h^2 \nabla_1^2 / 2m + (-Z_i e^2)|r_1 - R_i| + \sum_j (-Z_j e^2)/|r_1 - R_j|] \phi(r_1 - R_i)$$

$$U = \int\int_{allspace} dr_1 dr_2 \phi^*(r_1 - R_i) \phi^*(r_2 - R_i)[e^2/|r_1 - r_2|] \phi(r_2 - R_i)$$

where, φ($r_2 - R_i$) denotes the orbital function of electron 1 in the atom at $R_i$; m denotes the mass of an electron; −e denotes the charge of an electron; +$Z_i$e denotes the charge of an ion at $R_i$; <$M_i$> denotes the magnetization at $R_i$; <$N_i$> denotes the number of electrons at $R_i$; U denotes the Coulomb interaction between electrons; $E_s$ denotes the total energy which electrons bound by ions feel; $E_{para}$ denotes the paramagnetic potential; and $E_0$ (the first term of $E_{para}$) includes kinetic energy (first term), potential due to ions at $R_i$ (second term), and potential due to surrounding ions (third term). The difference in site energy between up-spin and down-spin is called exchange splitting energy, and it originates from $_sU<M_i>/2$ including Coulomb mutual action U between electrons. Incidentally, the term containing U should be considered for d-orbital, because d-orbital tends to localize in ions and have a large value of U. In the following, Δ denotes the exchange splitting energy.

The transfer integral t is represented as follows.

$$t = \int_{allspace} dr \phi^*(r-R_i) \left[ \sum_{k(\neq 1)} (-Z_k e^2)/|r_1 - R_k| \right] \phi(r_1 - R_i)$$

It represents the transfer energy of electrons between $R_i$ and $R_j$ due to the mutual action of electrons with surrounding ions.

The above-mentioned site energy $E_S$, the transfer integral t, and the Fermi level $E_F$ can be evaluated based on the result of calculations of the first principle electron state. In the present invention, their values were determined with reference to the following literature.

Harrison, Solid State Table of the Elements in Electronic Structure and the Properties of Solids (W. H. Freeman & Co., San Francisco, (1980))
J. Phys. Soc. Jpn. 60 376(1991)
Phys. Rev. B54 15314 (1996)

Figure 5:
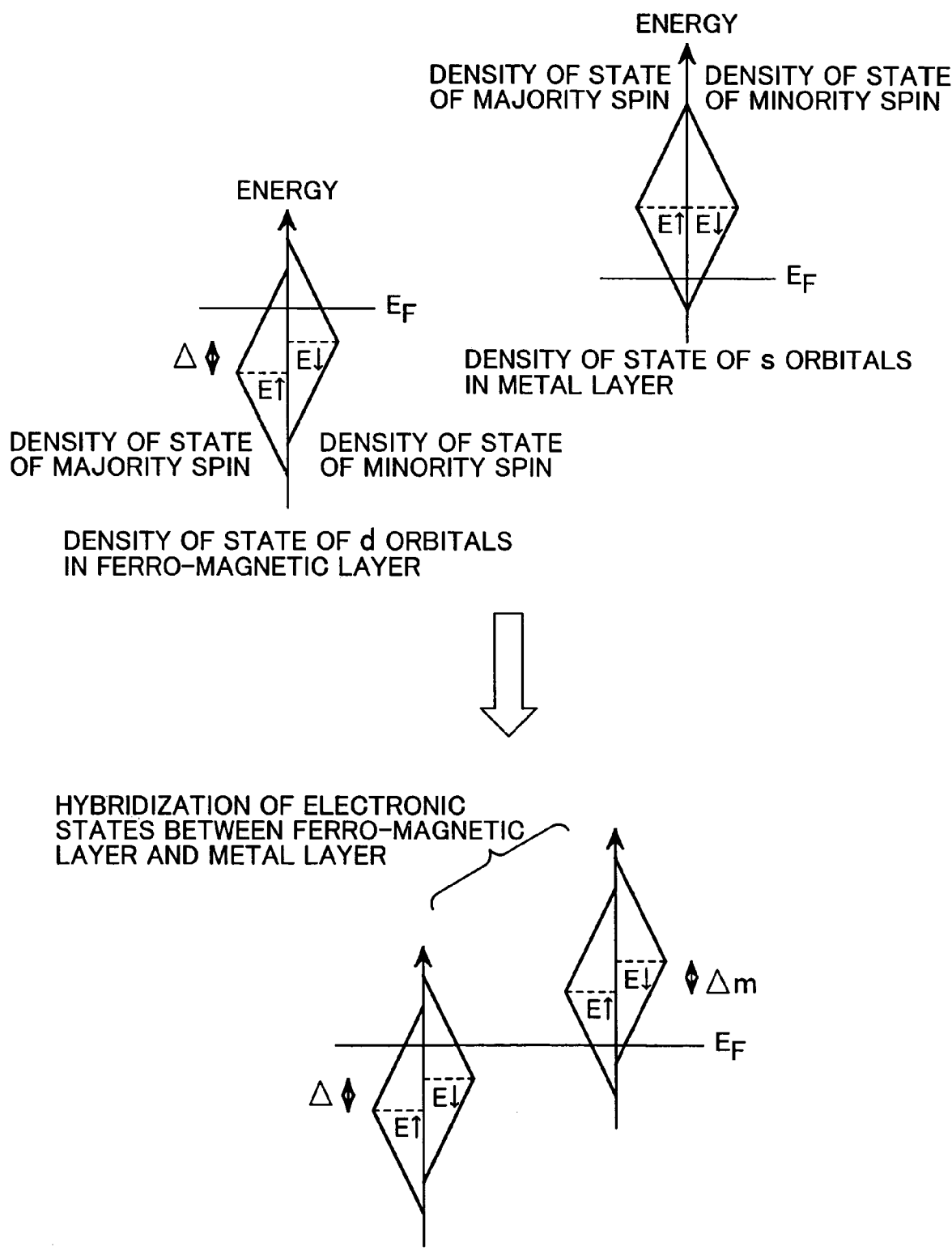
FIG. 5 is a diagram showing the density of state in the case where the ferromagnetic layer and the metallic layer are independent from each other (above) and the density of state in the case where the ferromagnetic layer and the metallic layer have joined together (below)

The density of state is schematically shown in FIG. 5 for d-orbital of the ferromagnetic layer and s-orbital of the metal layer based on the above-mentioned literature. It is noted from the figure that the metallic layer alone is originally non-magnetic and hence the exchange splitting does not exist between the up-spin state and the down-spin state. However, the metallic layer brings about exchange splitting upon combination with the ferromagnetic layer. In the following, Δm denotes the exchange splitting energy of the metallic layer.

The density of state of the end layer (adjacent to the insulating layer) of the metallic layer is included in the expression (given later) for current in the tunnel junction system. It is known that the metallic layer plays an important role in tunneling conduction. The difference between the number of majority electrons (the density of state) and the number of minority electrons (the density of state) in the metallic layer which originates from the exchange splitting plays an important role in the magnetoresistive effect.

(2) Explanation of the Method of Keldysh-Green Function (J. Phys. C: Solid St. Phys. 4, 916 (1971))

Figure 6A:
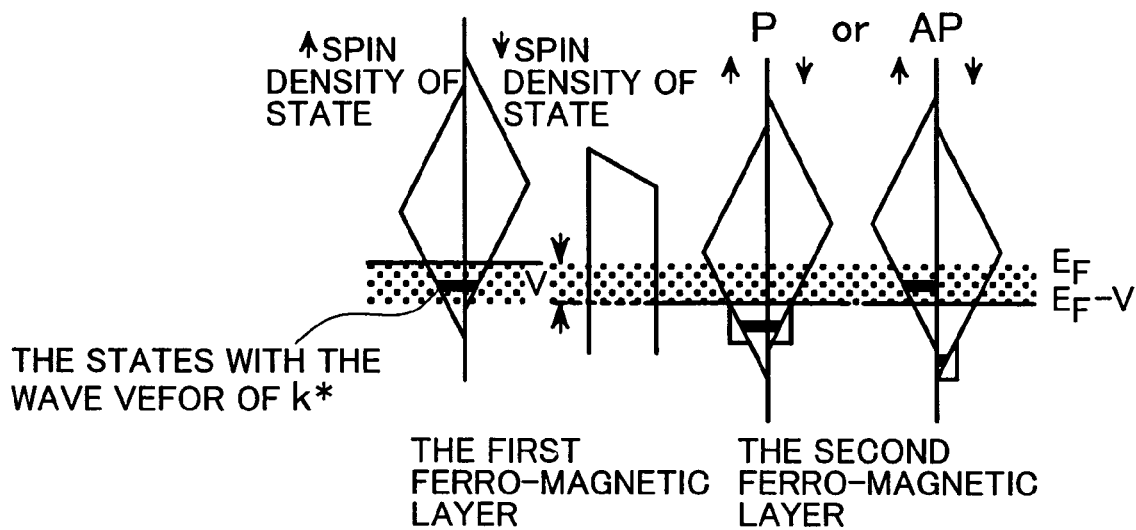
FIG. 6A is a diagram showing the density of state of the first and second metallic layers and the barrier of the insulating layer in the ferromagnetic tunnel junction element of the present invention. The energy region of electrons contributing to tunneling conduction is indicated by a dotted zone. The thick small bar (-) in the figure represents the state which has a certain wave number vector k*.

As compared with the resistivity of the insulating layer, that of other layers is negligibly small. Therefore, it is considered that the first ferromagnetic layer and the first metallic layer at the same potential and the second ferromagnetic layer and the second metallic layer are at the same potential, and only the insulting layer, which has a large resistivity, varies in voltage in the film thickness direction due to the surface charge of the metallic layer. In other words, only the barrier of the insulating layer varies in voltage in the film thickness direction. FIG. 6A is a schematic diagram showing the density of state of the first and second metallic layers and the barrier of the insulating layer which were obtained from the abovementioned tight binding model. The energy region of electrons contributing to tunneling conduction is indicated by a dotted zone. Incidentally, this schematic diagram shows only those parts necessary for the subsequent explanation, with the first and second ferromagnetic layers being omitted.

The value of current at the absolute zero by the method of Keldysh-Green Function is expressed as follows when electrons pass from the first ferromagnetic layer to the second ferromagnetic layer while keeping their spin direction.

$$I_s(V) = \int_{E_{F-V}}^{E_F} d\varepsilon \Gamma_s(\varepsilon, V)$$

$$\Gamma_s(\epsilon,V) = \Sigma_k |T_s(\epsilon,V,k)|^2 D_{L,s}(\epsilon,V,k) D_{R,s}(\epsilon,k)$$

where, s denotes spin (s=↑ or ↓), $|\Gamma_s(\epsilon, V,k)|^2$ denotes the transmission coefficient, $D_{L,s}(\epsilon,V,k)$ denotes the density of state of the end layer (adjacent to the insulating layer) of the first metallic layer 4 having an energy ($\epsilon$) and the dependence on the wave vector k, and $D_{R,s}(e,k)$ denotes the density of state of the end layer (adjacent to the insulating layer) of the first metallic layer 5 having an energy ($\epsilon$) and the dependence on the wave vector k. The integral expresses that electrons in the range from $E_{F-V}$ to $E_F$ contribute to tunneling conduction. What is important is that the conductance is summed over k because k is conserved in the layer for the system with crystalline regularity. This is a big difference from the conventional system with an amorphous insulating layer in which $\Gamma_s(\epsilon,V) \propto D_{L,s}(\epsilon,V) D_{R,s}(\epsilon)$, where $D_{L,s}(\epsilon,V) = \Sigma k D_{L,s}(\epsilon,V,k)/\Sigma k1$ and $D_{R,s}(\epsilon) = \Sigma k D_{R,s}(\epsilon,k)/\Sigma k1$.

Then, the magnetic resistivity is defined as follows to investigate the magnetoresistive effect.

$$TMR = 100 \times [I_P(V) - I_{AP}(V)]/I_P(V)[\%]$$

where, the current value is a sum of the current value due to up-spin and the current value due to down-spin. $I_{AP}$ represents parallel (anti-parallel) magnetization arrangement.

The present inventors are the first to apply the abovementioned method to real substances. They have demonstrated the possibility of realizing a highly sensitive magnetoresistive element by investigating individual substances based on the results of computer simulation.

This example presents a sample consisting of a first ferromagnetic layer 1 of Co or $Co_xFe_{1-x}$ (x=0.8–1.0), a first metallic layer 4 of Cu, an insulating layer 3 of Al—O, a second metallic layer 5 of Cu, and a second ferromagnetic layer 2 of Co or $Co_xFe_{1-x}$ (x=0.8–1.0). The first and second ferromagnetic layers 1 and 2 are 500 atoms thick. The first and second metallic layers 4 and 5 are one or two atoms thick. The insulating layer 3 is five atoms thick. All the layers have the crystal structure of simple cubic lattice.

The parameters for the tight binding model were determined as follows on the basis of the above-mentioned literature (Harrison, Electronic Structure and the Properties of Solids; J. Phys. Soc. Jpn. 60 (1991) 376; and Phys. Rev. B54 (1996). 15314

$E\uparrow - E_{Cu} = -2.5$ eV, $E\downarrow - E_{Cu} = -1.5$ eV, $E_{Al-O} - E_{Cu} = 80$ eV, and $E_F - E_{Cu} = -1.0$ eV where, $E\uparrow$ and $E\downarrow$ each denote the site energy of up-spin and down-spin of d-orbital of Co or $Co_xFe_{1-x}$ (x=0.8–1.0); $E_{Cu}$ denotes the energy of s-orbital of Cu; and $E_{Al-O}$ denotes the center of the conduction band of Al—O. Incidentally, the transfer integral was carried out assuming t=1.0 eV for all the substances in consideration of the width of the density of state.

For the ferromagnetic layer of Co or $Co_xFe_{1-x}$ (x=0.8–1.0), $\Delta \approx 1.0$ eV. For the metallic layer one atom thick on Co or $Co_xFe_{1-x}$ (x=0.8–1.0), $\Delta m \approx 0.3$ eV. The $\Delta m$ can be obtained from the difference in energy level between the up-spin state and down-spin state for k in the state of k having an energy in the vicinity of Fermi level.

Figure 7A:
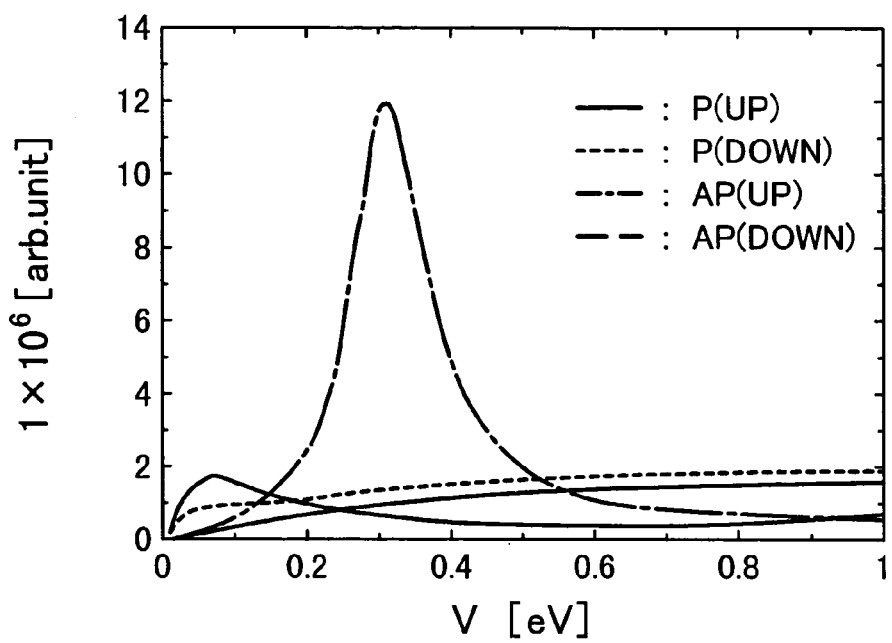
FIG. 7A is a diagram showing the current-voltage characteristics of the ferromagnetic tunnel junction element of the present invention, in which the ferromagnetic layer is formed from Co or $Co_xFe_{1-x}$ (x=0.8–1.0) and the metallic layer is one atom thick.

FIG. 7A shows how current depends on voltage. In the voltage range from V=0.2 to V=0.5, the current value of up-spin for the anti-parallel magnetization arrangement has a peak.

Figure 6B:
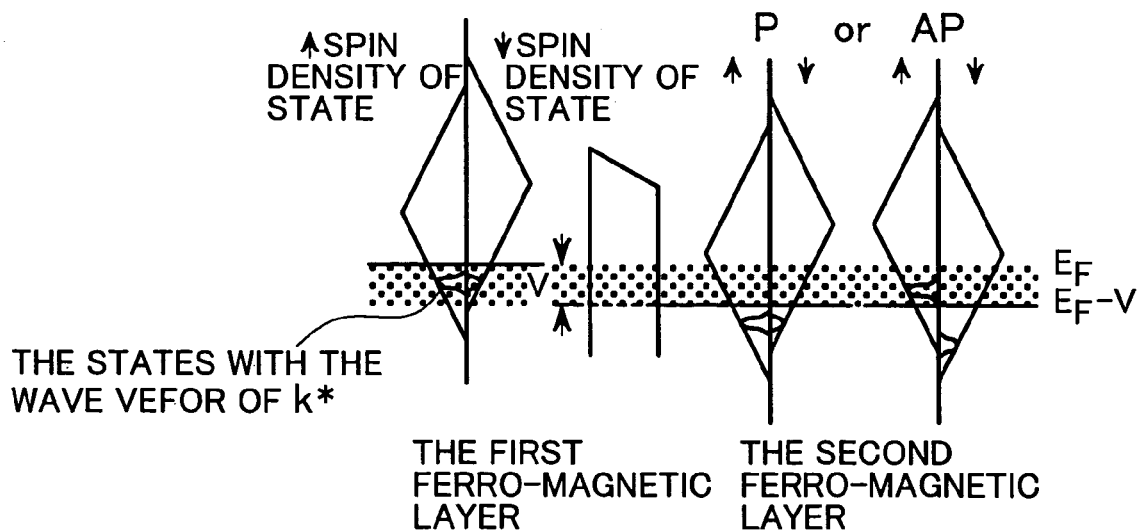
FIG. 6B is a diagram showing the density of state (single peak) with the wave number vector k* of the first metallic layer, the barrier of the insulating layer, and the density of state (single peak) with the wave number vector k* of the second metallic layer, in the ferromagnetic tunnel junction element of the present invention.

The mechanism for this peak is explained in the following. First, the center energy of the density of state of the metallic layer is obtained at a voltage V. By using the site energy $E\uparrow$ and $E\downarrow$ for up-spin state and down-spin state at zero voltage, the up-spin state of anti-parallel magnetization arrangement at a voltage V is $E\uparrow+V$ for the first metallic layer and $E\downarrow$ for the second metallic layer. See FIG. 7A. It is to be noted that $E\downarrow$ for the second metallic layer becomes the site energy of up-spin due to the anti-parallel magnetization arrangement. In the case where the first and second metallic layers are equal in energy, that is, $$E\uparrow+V=E\downarrow$$

up-spin electrons in antiparallel magnetization arrangement are in such a state that the state with a certain wave number vector k* of the first metallic layer and the state with the same wave number vector k* of the second metallic layer have an approximately equal energy. See FIG. 6A. This condition makes electrons in up-spin state to transmit easily. (By contrast, electrons in down-spin state go away.) This is apparent from the fact that the density of state $D_S(E,k)$ at each k has the single peak for the energy corresponding to the k (see FIG. 6B) and the current value increases when the peaks of the first and second metal layers have an equal energy (see the above-mentioned expression for current). On the other hand, in the case of parallel magnetization arrangement with up-spin and down-spin, the state for k* in the first metallic layer does not coincide with the state for k* in the second metallic layer but they tend to go away from each other. This condition makes it difficult for electrons to transmit. Incidentally, the above-mentioned expression may be written as $V=E\downarrow-E\uparrow$; this corresponds to an instance in which voltage is equal to the exchange splitting energy of the metallic layer. In fact, the peak position obtained coincides approximately with the above-mentioned exchange splitting energy $\Delta m$ ($\approx 0.3$ eV). That is, this condition permits only those electrons in the antiparallel up-spin state to transmit easily.

Figure 7B:
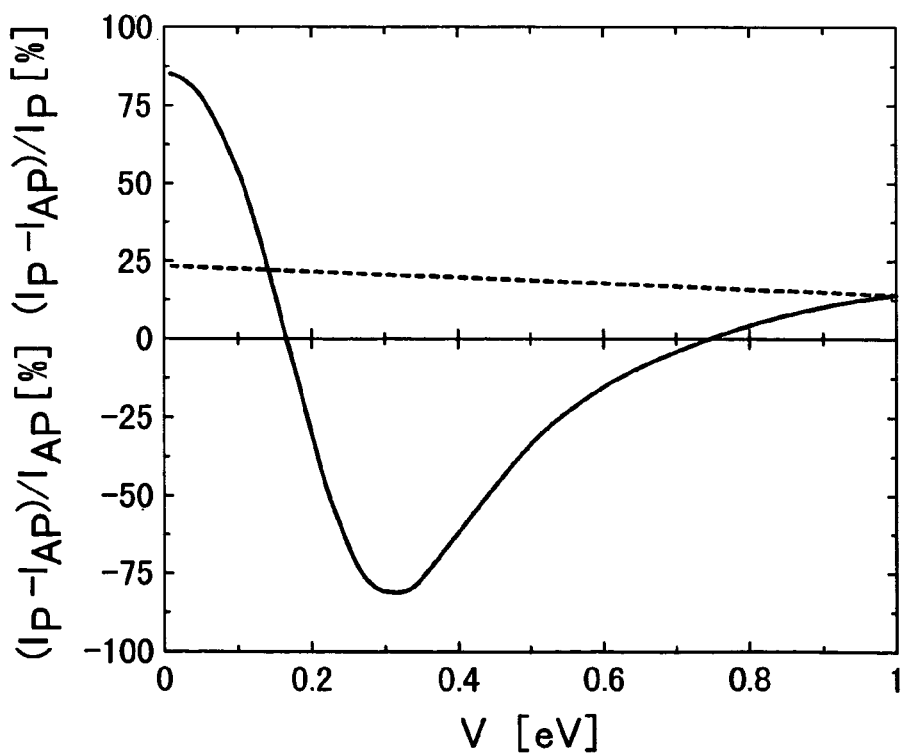
FIG. 7B is a diagram showing the magnetoresistivity-voltage characteristics of the ferromagnetic tunnel junction element of the present invention, in which the ferromagnetic layer is formed from Co or $Co_xFe_{1-x}$ (x=0.8–1.0) and the metallic layer is one atom thick. Incidentally, the dotted line represents the magnetoresistivity-voltage characteristics in the absence of the metallic layer.

As the voltage dependence of magnetoresistivity (in FIG. 7B) shows, the magnetoresistivity has the maximum value of 80% in the region from 0.2 V to 0.5 V. This magnitude is about three times larger than that in the case where the metallic layer does not exist (represented by the dotted line in FIG. 7B). Also, this system gives the magnetoresistivity higher than 70% even in the region from 0.01 V to 0.1 V. Thus, the magnetoresistive element in this example exhibits high sensitivity in the region from 0.2 V to 0.5 V and from 0.01 V to 0.1 V.

Figure 8A:
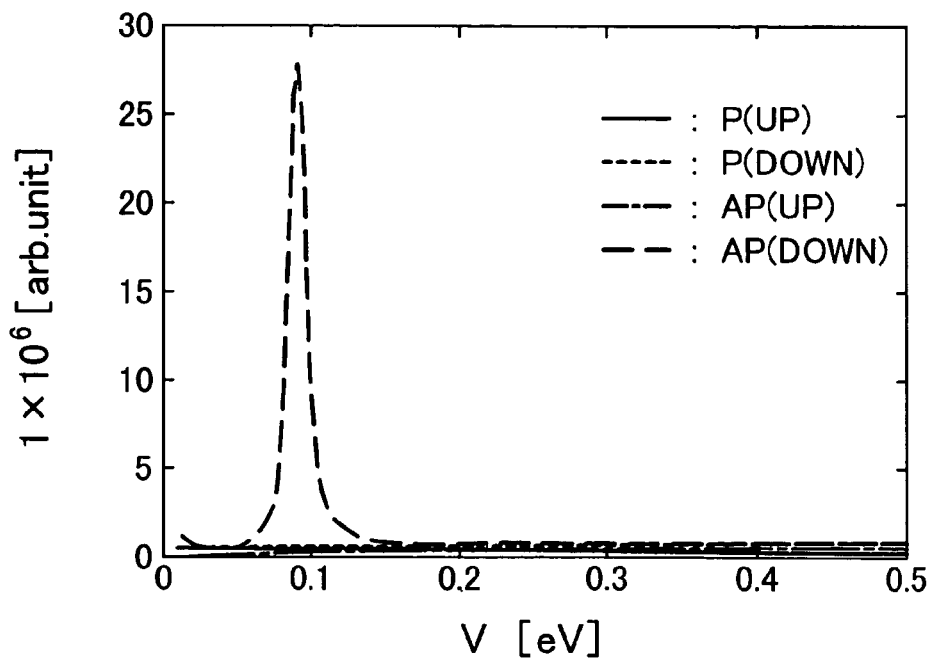
FIG. 8A is a diagram showing the current-voltage characteristics of the ferromagnetic tunnel junction element of the present invention, in which the ferromagnetic layer is formed from Co or $Co_xFe_{1-x}$ (x=0.8–1.0) and the metallic layer is two atoms thick.
Figure 8B:
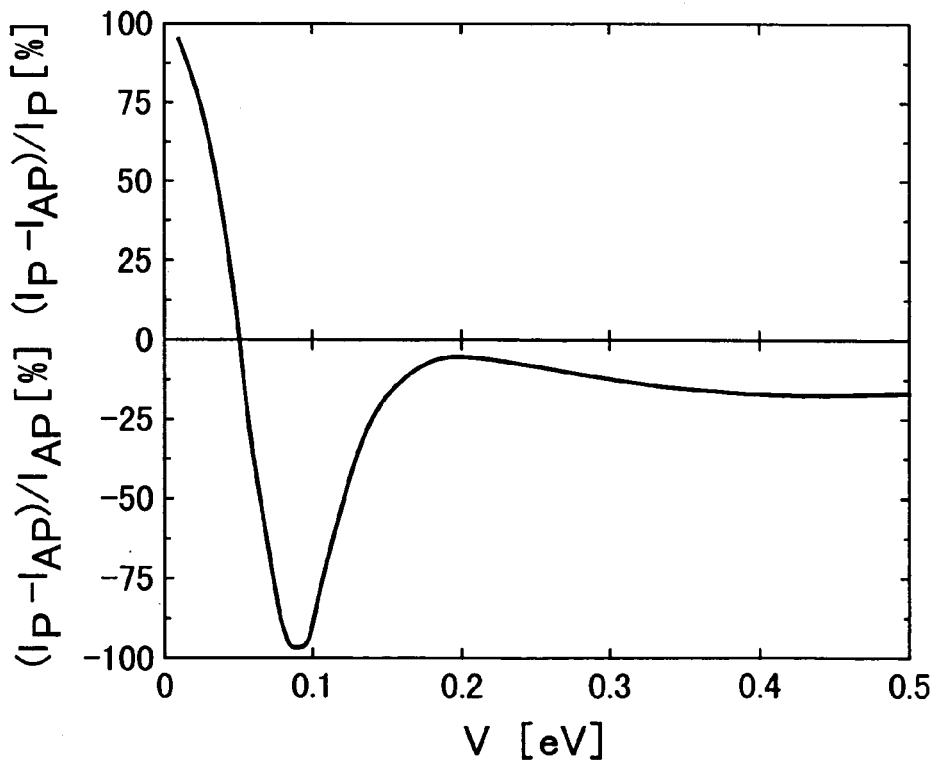
FIG. 8B is a diagram showing the magnetoresistivity-voltage characteristics of the ferromagnetic tunnel junction element of the present invention, in which the ferromagnetic layer is formed from Co or $Co_xFe_{1-x}$ (x=0.8–1.0) and the metallic layer is two atoms thick.

The computer simulation was carried out also in the case where the metallic layer is two atoms thick. In the end layer of the metallic layer on Co or $Co_xFe_{1-x}$ (x=0.8–1.0), the exchange splitting energy is $\Delta m \approx 0.09$ eV. The results are shown in FIG. 8.

The current value due to up-spin for anti-parallel magnetization arrangement has a peak in the voltage region from 0.07 V to 0.12 V. (See FIG. 8A.) In this voltage region, the magnetoresistivity has values larger than 70%. (See FIG. 8B.) Moreover, magnetoresistivity greater than 70% is obtained even in the region from 0.01 V to 0.03 V. Thus, the magnetoresistive element in this example exhibits high sensitivity in the region from 0.07 V to 0.12 V and from 0.01 V to 0.03 V.

The same investigation as above was conducted on samples in which the metallic layer is made of Ag or Au. Similar results as above were obtained because the parameters for Ag and Au are almost the same as those for Cu. Thus, the magnetoresistive element in this example also exhibits high sensitivity in the region from 0.07 V to 0.12 V and from 0.01 V to 0.03 V. Incidentally, the abovementioned characteristics are maintained even at room temperature because Co or $Co_xFe_{1-x}$ (x=0.8–1.0) has a Curie temperature higher than 1000 K.

EXAMPLE 2

The same computer simulation as in Example 1 was performed on samples in which the ferromagnetic layer is made of $Ni_xFe_{1-x}$ (x=0.8–1.0) and the metallic layer is made of Ag, Au, or Cu and is one atom thick.

The parameters were set up as follows on the basis of the literature mentioned in Example 1.

$E\uparrow-E_m=-2.25$ eV, $E\downarrow-E_m=-1.75$ eV, $E_{Al-O}-E_m=8.0$ eV, and $E_F-E_m=-1.0$ eV.

where, $E\uparrow$ and $E\downarrow$ are respectively the site energy of up-spin and down-spin of d-orbital of $Ni_xFe_{1-x}$ (x=0.8–1.0); $E_m$ is the energy of s-orbital of Cu, Ag, and Au; and $E_{Al-O}$ denotes the center of the conduction band of the insulating layer of Al—O. Incidentally, the transfer integral was carried out assuming t=1.0 eV for all the substances in consideration of the width of the density of state.

The exchange splitting energy is $\Delta m \approx 0.12$ eV at the end layer of the metallic layer on $Ni_xFe_{1-x}$ (x=0.8–1.0).

Figure 9A:
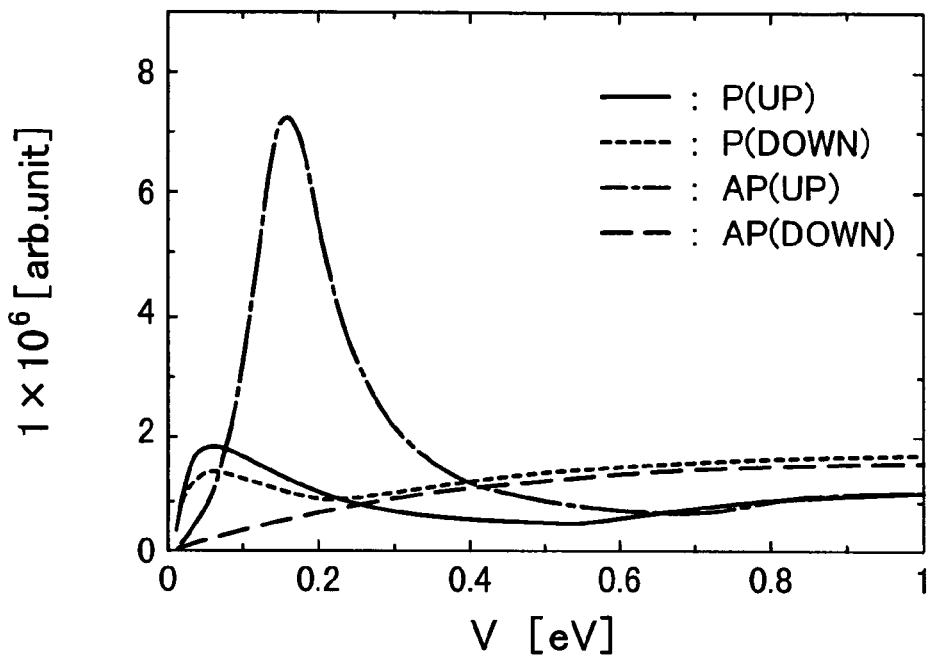
FIG. 9A is a diagram showing the current-voltage characteristics of the ferromagnetic tunnel junction element of the present invention, in which the ferromagnetic layer is formed from $Ni_xFe_{1-x}$ (x=0.8–1.0) and the metallic layer is one atom thick.
Figure 9B:
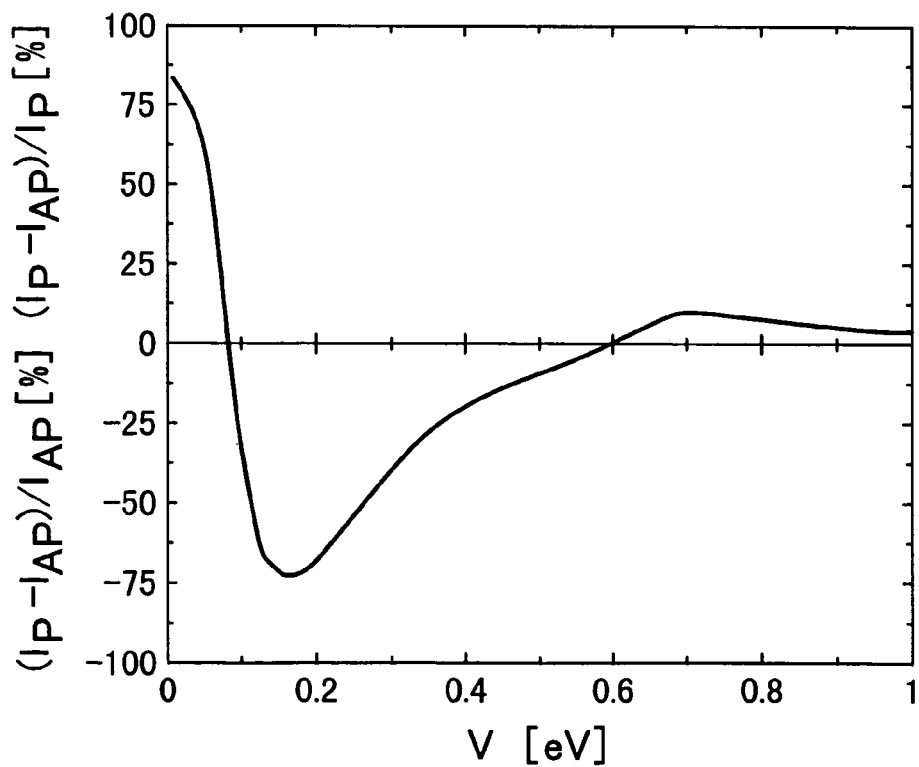
FIG. 9B is a diagram showing the magnetoresistivity-voltage characteristics of the ferromagnetic tunnel junction element of the present invention, in which the ferromagnetic layer is formed from $Ni_xFe_{1-x}$ (x=0.8–1.0) and the metallic layer is one atom thick.

The current value due to up-spin for anti-parallel magnetization arrangement has a peak in the voltage region from 0.1 V to 0.3 V. (See FIG. 9A.) In this voltage region, the magnetoresistivity has values larger than 70%. (See FIG. 9B.) Moreover, magnetoresistivity greater than 70% is obtained even in the region from 0.01 V to 0.05 V. Thus, the magnetoresistive element in this example exhibits high sensitivity in the region from 0.1 V to 0.3 V and from 0.01 V to 0.05 V.

The computer simulation was carried out also in the case where the metallic layer of Ag, Au, or Cu is two atoms thick. In the end layer of the metallic layer on $Ni_xFe_{1-x}$ (x=0.8–1.0), the exchange splitting energy is $\Delta m \approx 0.09$ eV.

Figure 10A:
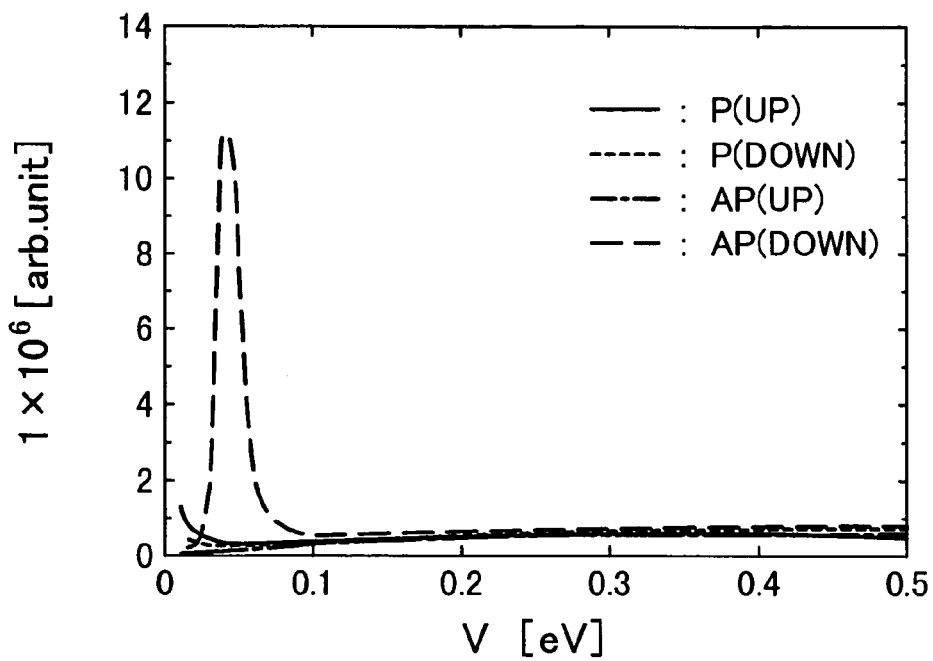
FIG. 10A is a diagram showing the current-voltage characteristics of the ferromagnetic tunnel junction element of the present invention, in which the ferromagnetic layer is formed from $Ni_xFe_{1-x}$ (x=0.8–1.0) and the metallic layer is two atoms thick.
Figure 10B:
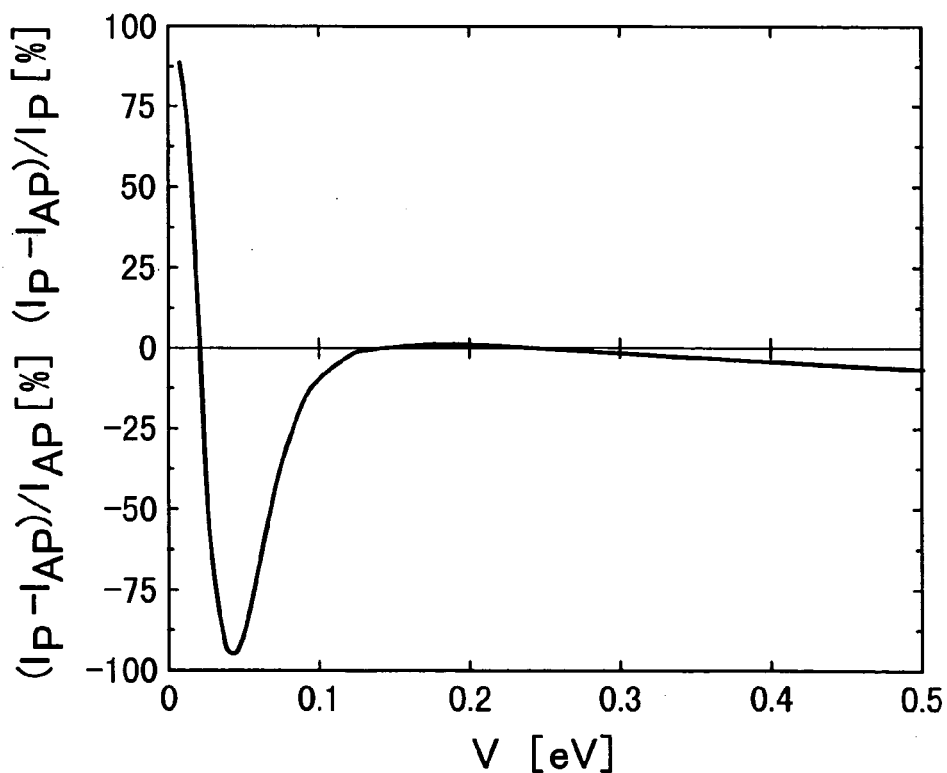
FIG. 10B is a diagram showing the magnetoresistivity-voltage characteristics of the ferromagnetic tunnel junction element of the present invention, in which the ferromagnetic layer is formed from $Ni_xFe_{1-x}$ (x=0.8–1.0) and the metallic layer is two atoms thick.

The current value due to up-spin for anti-parallel magnetization arrangement has a peak in the voltage region from 0.03 V to 0.06 V. (See FIG. 10A.) In this voltage region, the magnetoresistivity has values larger than 70%. (See FIG. 10B.) Thus, the magnetoresistive element in this example exhibits high sensitivity in the region from 0.03 V to 0.06 V.

Incidentally, the above-mentioned characteristics are maintained even at room temperature because $Ni_xFe_{1-x}$ (x 0.8–1.0) has a Curie temperature higher than 600 K.

EXAMPLE 3

The same computer simulation as in Example 1 was performed on samples in which the ferromagnetic layer is made of Fe and the metallic layer is made of Ag, Au, or Cu and is one atom thick.

The parameters were set up as follows on the basis of the literature mentioned in Example 1.

$$E\uparrow -E_m=-2.75 \text{ eV}, E\downarrow -E_m=-1.25 \text{ eV}, E_{Al-O}-E_m=8.0$$
$$\text{eV, and } E_F-E_m=-1.0 \text{ eV}.$$

where, $E\uparrow$ and $E\downarrow$ are respectively the site energy of up-spin and down-spin of d-orbitals of Fe; Em is the energy of s-orbitals of Cu, Ag, and Au; and $E_{Al-O}$ denotes the center of the conduction band of the insulating layer of Al—O. Incidentally, the transfer integral was carried out assuming t=1.0 eV for all the substances in consideration of the width of the density of state.

The exchange splitting energy is $\Delta m \approx 0.55$ eV in the end layer of the metallic layer on Fe.

Figure 11A:
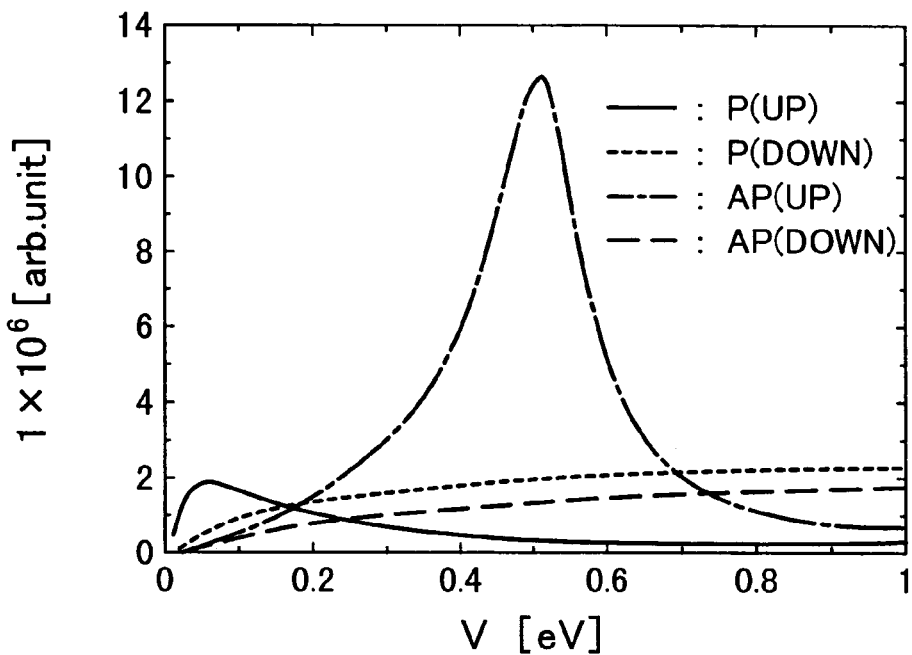
FIG. 11A is a diagram showing the current-voltage characteristics of the ferromagnetic tunnel junction element of the present invention, in which the ferromagnetic layer is formed from Fe and the metallic layer is one atom thick.
Figure 11B:
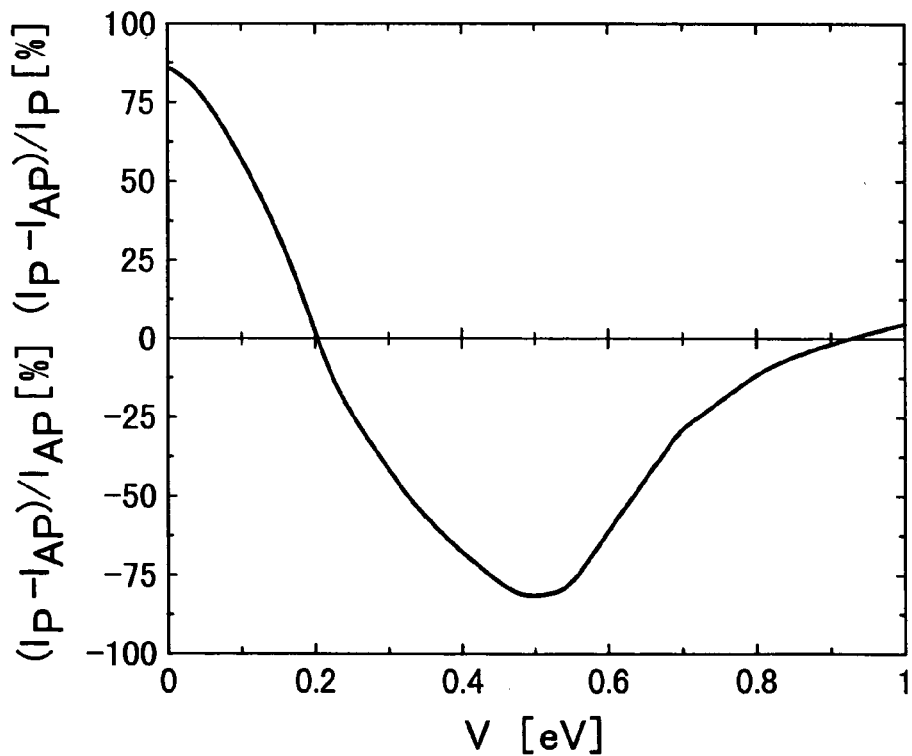
FIG. 11B is a diagram showing the magnetoresistivity-voltage characteristics of the ferromagnetic tunnel junction element of the present invention, in which the ferromagnetic layer is formed from Fe and the metallic layer is one atom thick.

The current value due to up-spin for anti-parallel magnetization arrangement has a peak in the voltage region from 0.3 V to 0.7 V. (See FIG. 11A.) In this voltage region, the magnetoresistivity has values larger than 70%. (See FIG. 11B.) Moreover, magnetoresistivity greater than 70% is obtained even in the region from 0.01 V to 0.15 V. Thus, the magnetoresistive element in this example exhibits high sensitivity in the region from 0.3 V to 0.7 V and from 0;01 V to 0.15 V.

The computer simulation was carried out also in the case where the metallic layer of Ag, Au, or Cu is two atoms thick. In the end layer of the metallic layer on Fe, the exchange splitting energy is $\Delta m \approx 0.14$ eV.

Figure 12A:
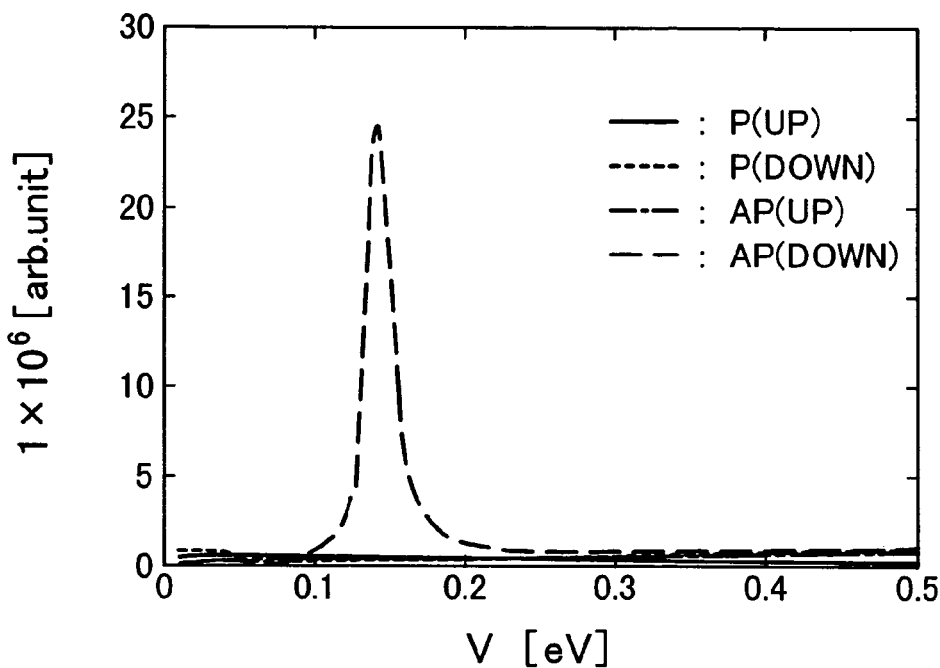
FIG. 12A is a diagram showing the current-voltage characteristics of the ferromagnetic tunnel junction element of the present invention, in which the ferromagnetic layer is formed from Fe and the metallic layer is two atoms thick.
Figure 12B:
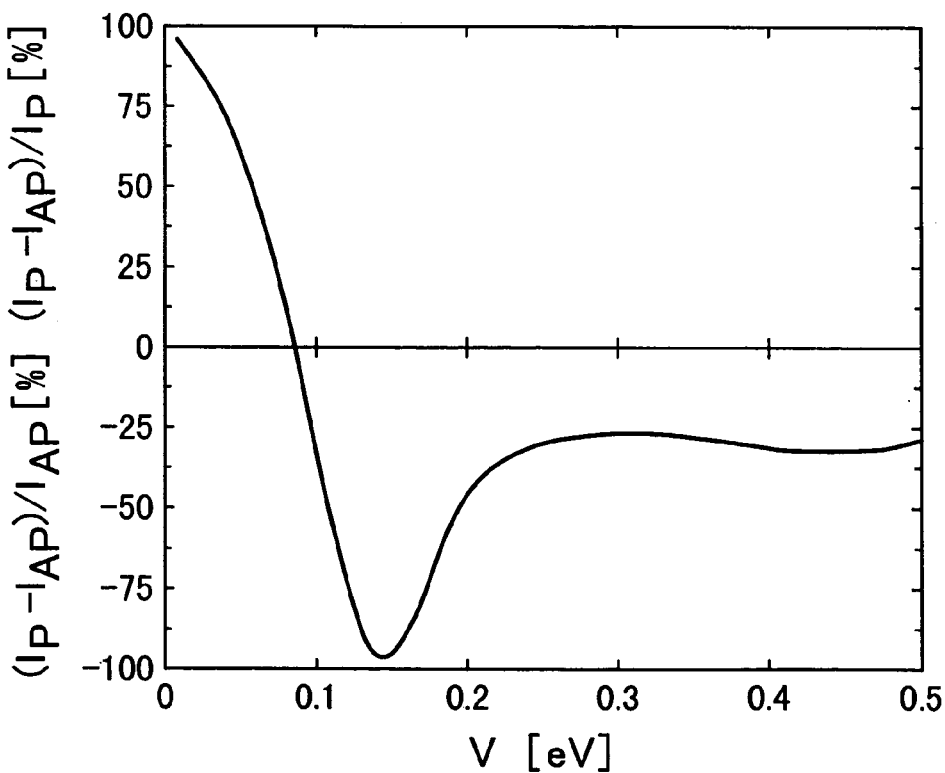
FIG. 12B is a diagram showing the magnetoresistivity-voltage characteristics of the ferromagnetic tunnel junction element of the present invention, in which the ferromagnetic layer is formed from Fe and the metallic layer is two atoms thick.

The current value due to up-spin for anti-parallel magnetization arrangement has a peak in the voltage region from 0.1 V to 0.2 V. (See FIG. 12A.) In this voltage region, the magnetoresistivity has values larger than 70%. (See FIG. 12B.) Thus, the magnetoresistive element in this example exhibits high sensitivity in the region from 0.1 V to 0.2 V and from 0.01 V to 0.05 V.

Incidentally, the above-mentioned characteristics are maintained even at room temperature because Fe has a Curie temperature higher than 1000 K.

EXAMPLE 4

Figure 13:
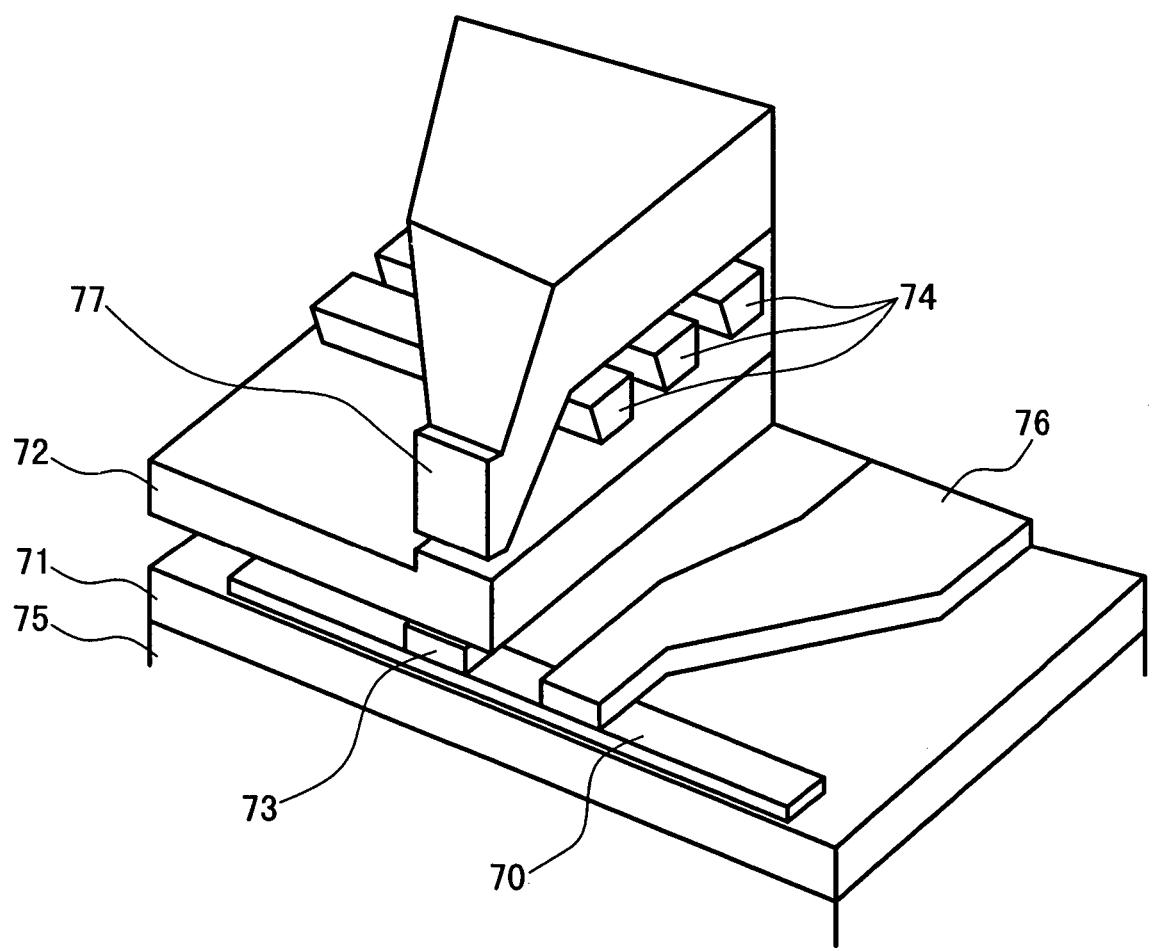
FIG. 13 is a schematic diagram showing the magnetic head of the present invention.

FIG. 13 is a schematic diagram showing the magnetoresistive head provided with the above-mentioned ferromagnetic tunnel junction element. The head consists of a substrate 75, a lower shield layer, an underlying layer, a ferromagnetic tunnel effect element (as the magnetoresistive element), an upper shield layer (functioning also as the lower core of the recording head), and an upper core for the recording head with a recording gap layer placed thereunder, which are formed sequentially on top of the other. The ferromagnetic tunnel effect element (as the magnetoresistive element) is held between a pair of electrodes to apply driving current to the element. This structure realizes the magnetoresistive head which exhibits the high ratio of change in magnetoresistance as mentioned in the foregoing examples.

EXAMPLE 5

Figure 14:
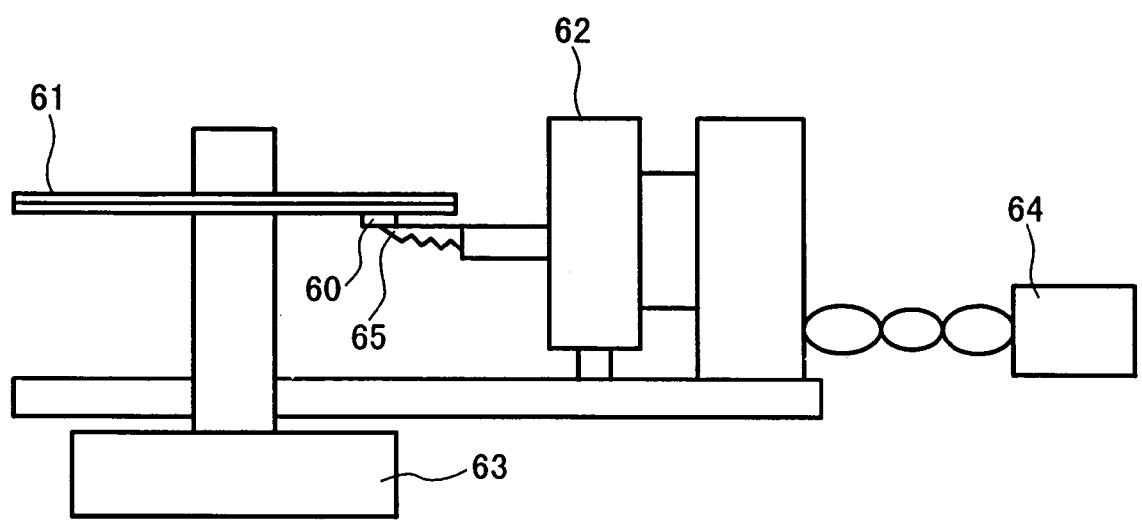
FIG. 14 is a schematic diagram showing the magnetic disk drive containing the magnetic head slider of the present invention.

FIG. 14 is a schematic diagram showing the magnetic disk drive containing the magnetic head slider 60 which is provided with the magnetoresistive head of the present invention. The slider 60 has the magnetoresistive head provided with the magnetoresistive head of the present invention, a pair of electrodes, and terminals 65 to supply current to the electrodes. This magnetic slider exhibits the high ratio of change in magnetoresistance as mentioned in the foregoing examples.

EXAMPLE 6

Figure 15:
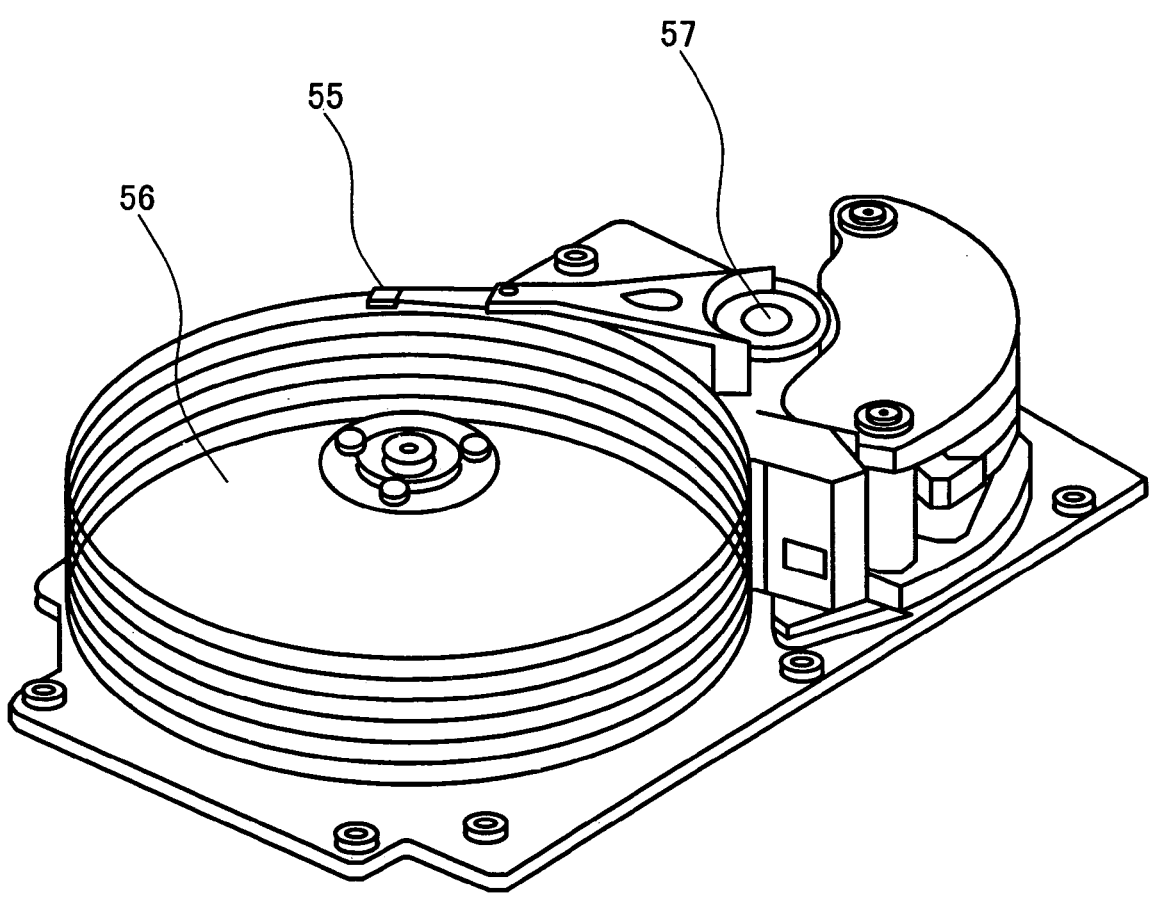
FIG. 15 is a schematic diagram showing the magnetic disk drive of the present invention.

FIG. 15 is a schematic diagram showing the magnetic disk drive which is provided with the magnetic head slider of the present invention. The magnetic head slider 55 is equipped with the ferromagnetic tunnel effect element of the present invention. The magnetic disk drive has a power supply 64 (see the power supply 6 in FIG. 1) to supply current to the ferromagnetic tunnel effect element. This structure realizes the magnetic disk drive with high-sensitive reproducing characteristics owing to the high ratio of change in magnetoresistance as mentioned in the foregoing examples.

The ferromagnetic tunnel junction element of the present invention has a laminate structure of ferromagnetic layer/metallic layer/insulating layer/metallic layer/ferromagnetic layer. (The metallic layer is one atom thick or two atoms thick.) The metallic layer and insulating layer have the crystalline regularity. The element is capable of detecting magnetism with its high magnetoresistivity, about three times that of conventional elements, at finite voltages. This element makes it possible to realize a highly sensitive magnetoresistive head. The magnetic head is used for the magnetic head slider which realizes a magnetic disk drive capable of reproducing magnetic information with high sensitivity.

The foregoing invention has been described in terms of preferred embodiments. However, those skilled, in the art will recognize that many variations of such embodiments exist. Such variations are intended to be within the scope of the present invention and the appended claims.

What is claimed is:

1. A tunnel magnetoresistive head comprising:
   a magnetoresistive element having a tunnel insulating layer, first and second ferromagnetic layers arranged on both sides of said tunnel insulating layer, a first noble metal layer formed between said tunnel insulating layer and said first ferromagnetic layer, and a second noble metal layer formed between said tunnel insulating layer and said second ferromagnetic layer,
   magnetic shield layers formed on both sides of said magnetoresistive element, and
   a pair of electrodes to apply drive current to said magnetoresistive element,
   wherein said first and second ferromagnetic layers are comprised of Co or $Co_xFe_{1-x}$ (x=0.8–1.0), and
   wherein a region of the magnetoresistive element operating voltage is from 0.2 V to 0.5 V.

2. A tunnel magnetoresistive head according to claim 1, wherein said first and second noble metal layers are single crystal layers.

3. A tunnel magnetoresistive head comprising:
   a magnetoresistive element having a tunnel insulating layer, first and second ferromagnetic layers arranged on both sides of said tunnel insulating layer, a first noble metal layer formed between said tunnel insulating layer and said first ferromagnetic layer, and a second noble metal layer formed between said tunnel insulating layer and said second ferromagnetic layer,
   magnetic shield layers formed on both sides of said magnetoresistive element, and a pair of electrodes to apply drive current to said magnetoresistive element, wherein said first and second ferromagnetic layers are comprised of Co or $Co_xFe_{1-x}$ (x=0.8–1.0), and wherein a region of the magnetoresistive element operating voltage is from 0.01 V to 0.1 V.

4. A tunnel magnetoresistive head according to claim 3, wherein said first and second noble metal layers are single crystal layers.

5. A tunnel magnetoresistive head comprising:

a magnetoresistive element having a tunnel insulating layer, first and second ferromagnetic layers arranged on both sides of said tunnel insulating layer, a first noble metal layer formed between said tunnel insulating layer and said first ferromagnetic layer, and a second noble metal layer formed between said tunnel insulating layer and said second ferromagnetic layer, magnetic shield layers formed on both sides of said magnetoresistive element, and a pair of electrodes to apply drive current to said magnetoresistive element, wherein said first and second ferromagnetic layers are comprised of Fe, and wherein a region of the magnetoresistive element operating voltage is from 0.01 V to 0.15V.

6. A tunnel magnetoresistive head according to claim 5, wherein said first and second noble metal layers are single crystal layers.

7. A tunnel magnetoresistive head comprising:

a magnetoresistive element having a tunnel insulating layer, first and second ferromagnetic layers arranged on both sides of said tunnel insulating layer, a first noble metal layer formed between said tunnel insulating layer and said first ferromagnetic layer, and a second noble metal layer formed between said tunnel insulating layer and said second ferromagnetic layer, wherein magnetic shield layers are formed on both sides of said magnetoresistive element, wherein a pair of electrodes applies drive current to said magnetoresistive element, wherein said first and second ferromagnetic layers are comprised of Fe, and wherein a region of the magnetoresistive element operating voltage is from 0.3V to 0.7 V.

8. A tunnel magnetoresistive head according to claim 7, wherein said first and second noble metal layers are single crystal layers.

9. A tunnel magnetoresistive head comprising:

a magnetoresistive element having a tunnel insulating layer, first and second ferromagnetic layers arranged on both sides of said tunnel insulating layer, a first noble metal layer formed between said tunnel insulating layer and said first ferromagnetic layer, and a second noble metal layer formed between said tunnel insulating layer and said second ferromagnetic layer, magnetic shield layers formed on both sides of said magnetoresistive element, and a pair of electrodes to apply drive current to said magnetoresistive element, wherein said first and second ferromagnetic layers are comprised of $Ni_xFe_{1-x}$ (x=0.8–1.0), and wherein a region of the magnetoresistive element operating voltage is from 0.03 V to 0.06 V.

10. A tunnel magnetoresistive head according to claim 9, wherein said first and second noble metal layers are single crystal layers.

* * * * *